United States Patent [19]

Kirilov et al.

[11] Patent Number: 4,754,177
[45] Date of Patent: Jun. 28, 1988

[54] DEVICE FOR MAGNETIC PULSE TREATMENT OF FERROMAGNETIC MATERIAL

[75] Inventors: Kiril D. Kirilov; Georgi Y. Pundev; Janet I. Mihailova; Nedelcho H. Todorov, all of Sofia, Bulgaria

[73] Assignee: N P K "Elektronna Obrabotka Na Materialite I Novi Technologit", Sofia, Bulgaria

[21] Appl. No.: 891,471

[22] Filed: Jul. 29, 1986

[30] Foreign Application Priority Data

Jul. 29, 1985 [BG] Bulgaria .................................. 71263

[51] Int. Cl.[4] ............................................ H03K 17/60
[52] U.S. Cl. .................................... 307/630; 307/257; 307/641; 328/69
[58] Field of Search ....................... 307/252, 412, 257; 315/340; 328/69; 307/270

[56] References Cited

U.S. PATENT DOCUMENTS

| 3,643,112 | 2/1972 | Perrin | 307/252 P |
| 4,017,744 | 5/1977 | Johnson | 307/252 Q |
| 4,571,499 | 2/1986 | Wein | 307/252 P |

Primary Examiner—Stanley D. Miller
Assistant Examiner—B. P. Davis
Attorney, Agent, or Firm—Klein and Vibber

[57] ABSTRACT

A device for magnetic pulse treatment of ferromagnetic materials applicable in the engineering industry and used for changing the physicomechanical properties of materials treated, treats the material in a winding, positive potential being fed from a supply unit across a controllable switch to the anodes of first diodes and cathodes of second diodes which are energized. Capacitors then are charged to the voltage of the supply source for the time for which controllable switch is on. Then at different time intervals control pulses are fed to controlling thyristor electrodes. One capacitor discharges across the winding and energized thyristor; current in specific direction running across the winding. Then, the other capacitor and thyristor discharge and current of opposite direction runs across the winding, thus forming a bipolar pulse magnetic field affecting the material physical and mechanical properties, the magnetization and demagnetization running for about 1 minute.

4 Claims, 1 Drawing Sheet

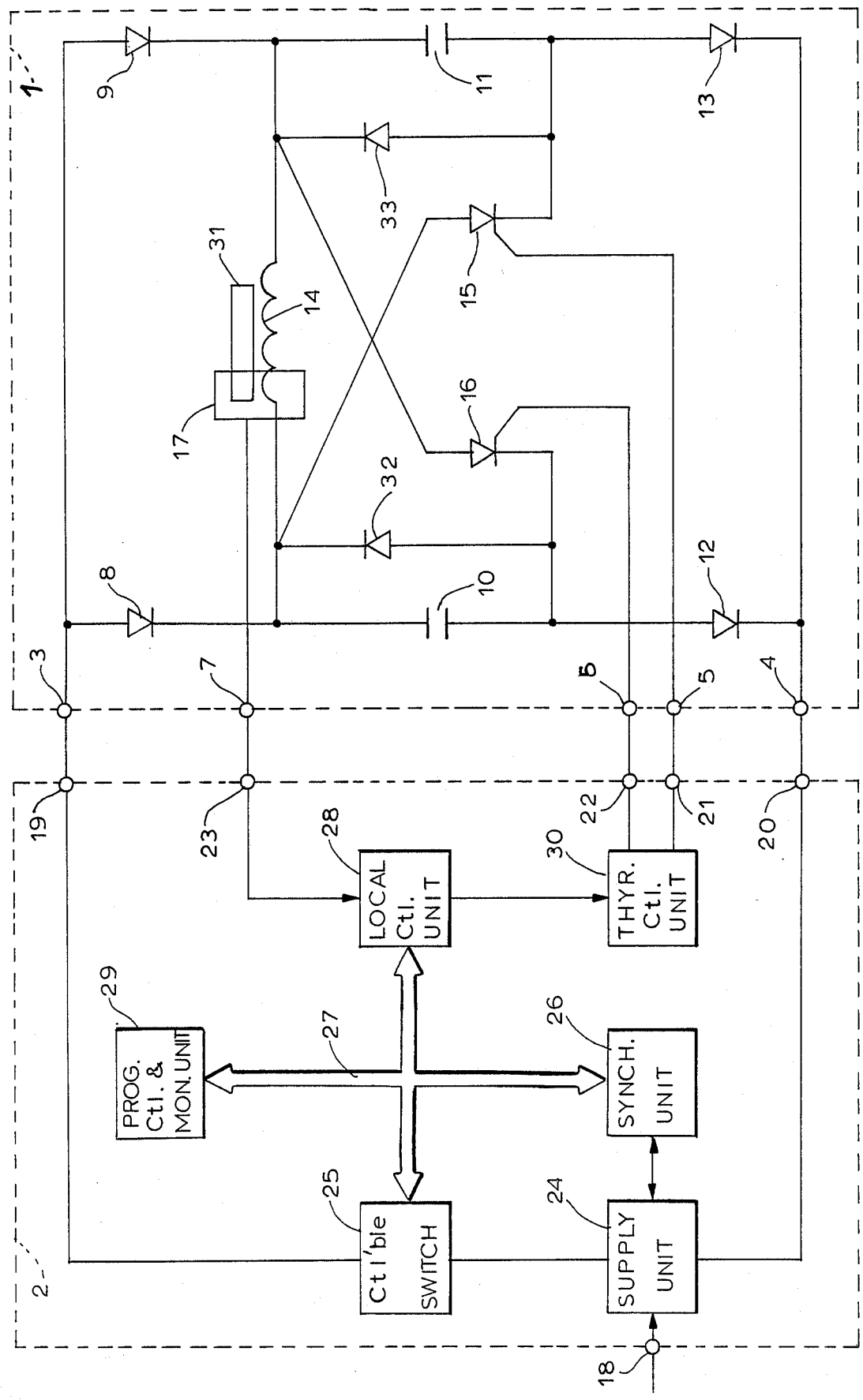

DEVICE FOR MAGNETIC PULSE TREATMENT OF FERROMAGNETIC MATERIAL

This invention is related to a device for magnetic pulse treatment of ferromagnetic materials applicable in the engineering industry for enginerring physicomechanical properties.

BACKGROUND OF THE INVENTION

Known devcies for magnetic pulse treatment of ferromagnetic materials contain a power inductor and a control system. The power inductor has an inductor coil, two supply inputs, two control inputs and a control output, made of two identical circuits each having an inductor coil winding and a capacitor connected in series, and a thyristor connected in parallel to them. The common point of the thyristor anode with the capacitor is connected to the respective supply input, and the common thyristor cathode point with the respective winding being connected to frame. The control electrode of each thyristor is connected to the respective inductor control input. The output of a start-up sensor is connected to the control output. The control system has two supply outputs each connected to the respecitve power inductor supply input; two control outputs each connected to the respective inductor control input; one control input connected to the inductor control output; a thyristor control unit, the outputs of which are connected to the respective control output; a control unit, the input of which is connected to the control input an its output connected to the thyristor control unit input. A second output of the control unit is connected to the control input of a supply unit executed in the form of an adjustable stabilized rectifier, the outputs of which are connected to the respective supply output. The supply unit AC input is connected to an AC supply input of the second system, which input is connected across a second supply unit to the supply input of the thyristor control unit.

A disadvanatage of the known devices is the unsatisfactory magnetic field characteristics expressed in a limited maximum magnetic induction, operting frequency and homogeneity. This disadvantage results from the use of two windings in the inductor coil, limiting the spectrum of sizes of the material to be treated, and as a result of parasitic magnetic field during the charging of the capacitors across the winding which is not operating at the moment.

SUMMARY OF THE INVENTION

It is an object of this invention to make a device for magnetic pulse treatment of ferromagnetic materials having a superior material treatment efficiency achieved by improving the magnetic field characteristics.

This object is achieved by a device for magnetic pulse treatment of ferromagnetic materials having a power inductor and a control system. The power inductor has an inductor coil; two (first and second) supply inputs each connected to a resepctive (first and second) supply output of the control system; two (first and second) control inputs each connected to respective (first and second) control outputs of the control system; and a feedback control output being connected to a feedback control input of the control system. The control system is made of a supply unit which is connected to its AC input, and one of its outputs being connected to one of the supply outputs (e.g. the second supply output). A feedback control unit is connected to the feedback control input, and its output is connected to a thyristor control unit, the outputs of which are connected to the first and second control outputs of the control system.

According to the invention, the inductor coil has one winding being connected at each end to the anode of a respective thyristor and the common point of one pole of a respective capacitor and the cathode of a respective first diode. The cathodes of the thyristors are respectively connected to the other pole of each other's respective capacitor. The anodes of the two repsective first diodes are both connected to one of the supply inputs of the power inductor. The cathode of each thyristor is also connected to the anode of a respective second diode, the cathode of which is connected to the other power inductor supply input.

In the control system, a controllable switch is connected between another output of the supply unit and the control system's other (e.g. first) supply output.

It is possible that the feedback control unit be a local one where, by means of an interface, it might be connected to a programmable control unit and monitoring device, to a synchronizing unit and to the control input of the controllable switch, the synchronizing unit being bilaterally connected to the supply unit.

It is also advantageous to connect a third diode in parallel with each capacitor, the cathode of which is connected to the end of the inductor coil winding.

An advantage of this device is the greater material treatment efficiency, as a result of which the physicomechanical characteristics, e.g. the wear resistance, of the materials treated are improved. Another advantage is the ability to optimize and automate the parameters of the effective field, the ability to control more than one power inductor and the capability of including this device in flexible automated manufacturing sytems. In addition, due to the diode connected in parallel to each capacitor, power consumption is reduced, the spectrum of diameters of the treated materials is extended as a result of the ability to increase the winding diameter, and the treatment time is reduced as a result of the improved steepness of the magnetic pulses.

BRIEF DESCRIPTION OF THE DRAWINGS

The exemplary execution of the device in accordance with the invention is illustrated in the single FIGURE which is a schematic diagram of the circuit of the device of the invention.

DETAILED DESCRIPTION

The device of the invention comprises a power inductor 1 and a control system 2. Power inductor 1 has first and second supply inputs 3 and 4, first and second control inputs 5 and 6, and one feedback control output 7. The circuits of the power inductor comprises two parallel circuits each made of a capacitor 10, respectively 11 connected in series between the cathode of first diode 8, respectively 9 and the anode of second diode 12, respectively 13. The anodes of the first diodes 8, 9 are mutually conected to the first supply input 3, and the cathodes of the second diode 12, 13 are mutually connected to the second supply input 4.

An inductor coil winding 14 is connected at one end to the common point of the cathode of the first diode 8 and one pole of the capacitor 10. The other end of winding 14 is connected to the common point of diode 9 and capacitor 11.

Two thyristors 15, respectively 16 are connected as follows: the cathode of thyristors 15 is connected to the common point of capacitor 11 and second diode 13 while the anode of thyristor 15 is connected to the common point of first diode 8 and the capacitor 10. Thyristor 16 is similarly connected: the cathode of thyristor 16 is connected to the common point of capacitor 10 and second diode 12 while the anode of thyristor 16 is connected to the common point of first diode 9 and the capacitor 11. The control electrodes of thyristors 15, 16 are connected to the respective first and second control inputs 5, 6 of power inductor 1.

A third diode 32, respectively 33 is connected to the circuit of power inductor 1, the cathode of which diode 32, 33 is connected in the common point of winding 14 to the respective capacitor 10, 11, and its anode is connected in the common point of respective capacitor 10, 11 to the cathode of the respective thyristor 15, 16.

A feedback sensor 17 is connected to winding 14 and the output of the sensor 17 is connected to the feedback control output 7 of power inductor 1.

The control system 2 has AC supply input 18, first and second supply outputs 19, respectively 20, first and second control outputs 21, 22, feedback control input 23 and supply unit 24. The input of supply unit 24 is connected to AC input 18, and one of its outputs, across controllable switch 25, executed as an electronic adjusting switch, is connected to the first supply output 19. The other output of supply unit 24 is connected directly to the second supply output 20. Synchronizing unit 26 is bilaterally connected to supply unit 24 and across interface 27 is connected to controllable switch 25, to local control unit 28 and to a programmable control and monitoring unit 29. An output of the local control unit 28 is connected to thyristor control unit 30 which is connected to control outputs 21, 21, and one of the controlling inputs of the control unit 28 is connected to feedback control input 23 of the control system 2.

The supply outputs 19, 20 of the control system 2 are connected to respective supply inputs 3, 4 of power inductor 1, the control outputs 21, 22 of the control unit 2 being connected to respective control inputs 5, 6 of the inductor, the feedback control output 7 of which is connected to feedback control input 23 of the control system 2.

The operation of this invention is as follows:

The treated material 31 is fitted in winding 14 where positive potential towards supply output 20 is fed from supply unit 24 across controllable switch 25 to the supply output 19. The potential from the supply outputs 19, 20 of the control system 2 are fed across the respective supply inputs 3, 4 of power inductor 1 to the anodes of the first diodes 8, 9 and the cathodes of the second diodes 12, 13 which are energized. As a result of this, capacitors 10, 11 are charged to voltage determined from the voltage of the supply unit 24, for the time for which the controllable switch 25 was closed, and the time constant of their charging circuit—the resistance of the energized diodes 8, 12, or 9, 13, respectively, and the value of the capacity of the respective capacitors 10, 11. Then control pulses are fed from thyristor control unit 30 controlling thyristors 15, 16 by their controlling electrodes at different time interval. As a result of this, one of the capacitors, e.g. 10, discharges across winding 14 and the energized thyristor 16. Current in a specified direction runs across winding 14. In the next moment, the other capicitor 11 is discharged when a control pulse is fed to the other thyristor 15 and current runs across winding 14 in the opposite direction. The currents of different directions produced at the two different moments of time cause a bipolar pulse magnetic field which affects the physicomechanical properties of the treated material 31.

The magnetizing and demagnetizing in the pulse magnetic field in experimentation continued for a time on the order of one minute.

In diodes 32, 33 after the complete discharge of each capacitor 10, or 11, respectively, self-induction e.m.f. is induced in winding 14, the positive pole of which is applied to the anode of thyristor 16 energized to this moment, respectively thyristor 15, and its negative pole—to the cathode of diode 32, 33 connected to the just discharged capacitor 10 or 11, respectively. As a result of this, thyristor 16, respectively 15 remains energized after the moment of the complete discharge of the respective capacitor 10, or 11 respectively, and diode 32, or 33 respectively, is energized. For this reason, current runs from the self-induction induced e.m.f. across the circuit of the energized thyristor 16, respectively 15, and diode 32, respectively 33. It assists in reducing and eliminating this voltage, as a result of which the re-charging of the respective capacitor 10, respectively 11, is eliminating to voltage having polarity opposite to the operating one, or that polarity caused by its charging. Capacitors 10, 11 can be monopolar.

Due to the eliminated counteracting electromotive force of self-induction in the winding 14, the magnetic pulse front steepness is improved, hence the treatment efficiency becomes better and treatment time is reduced.

A specific algorithm of control for the controllable switch 25 is set by the programmable control and monitoring unit 29, synchronized by synchronizing unit 26 with the frequenct of the AC supply voltage by means of which the charging voltage is determined for the respective capacitor 10, 11 and a specific algorithm for operation of the local control unit 28, which on its turn controls the control unit 30 for thyristors 15, 16. The sequence and the time of energizing thyristors 15, 16 is determined by them. In this way the intensity, polarity and frequency of the magnetic pulses is set created by winding 14, treating material 31. Treatment is controlled by the feedback sensor 17 and is optimized by the local control unit 28 and the programmable control and monitoring unit 29. After treatment, the material is demagnetized in the usual manner.

This device was used in experiments by treating 4.8 mm diameter screw drills with the following operating parameters after the treatment; cutting speed 24.13 m/min, 1600 r.p.m., feeding pitch 0.1 mm/fillet, 15 mm deep machining, material ST 45 sheet steel, cooling by 5% sulphor oil solution in water.

The drills treated in this device are twice as wear resistant in comparison with those treated by known devices.

Although the invention is described and illustrates with reference to a preferred embodiment thereof, it is to be expressly understood that it is in no way limited to the disclosure of such preferred embodiment but is capable of numerous modifications within the scope of the appended claims.

We claim:

1. A device for magnetic pulse treatment of ferromagnetic materials comprising a power inductor and a control system, said control system comprising a power input, a first and second supply output, a first and second control output, and a control input;

said power input being connected to an external AC source and to an input of a supply unit;

said supply unit having two outputs, one of said supply unit outputs being connected to the second supply output of said control system, and the other of said supply unit outputs being connected by means of a controllable switch to the first supply output of the control system;

the control input of said control system being connected to a control unit, an output of said control unit being connected to an input of a thyristor control unit, outputs of said thyristor control unit being connected to said first and second outputs;

said power inductor comprising an inductor coil winding, two supply inputs, each being connected to the respective supply output of the control system, two control inputs, each being connected to the respective control output of the control system, and a feedback sensor having a control output being connected to the control input of the control system;

said supply inputs being connected to each other by two parallel circuits, each parallel circuit comprising in series a first diode, a capacitor, and a second diode, said first diode being connected by its anode to said first supply input and said second diode being connected by its cathode to said second supply input;

said inductor coil winding being connected at one end to a common point between said first diode and said capacitor of one of said parallel circuits and at the other end to a common point between said first diode and said capacitor of the other of said parallel circuits;

said power inductor further comprising first and second thyristors, an anode of first thyristor being connected to the common point between said first diode and said capacitor of one of said parallel circuits and a cathode of said first thyristor being connected to the common point between said second diode and said capacitor of the other of said parallel circuits;

an anode of said second tyristor being connected to a common point between said first diode and said capacitor of the other of said parallel circuits and a cathode of said second thyristors being connected to a common point between said second diode and said capacitor of the one of said parallel circuits;

control electrodes of said first and second thyristors being connected to respective control inputs of said power inductors, 2. A device for magnetic pulse treatment of ferromagnetic materials, as claimed in claim 1, wherein said control unit is a local one and is connected by means of an interface to a programmable control and monitoring unit, to a synchronizing unit and to a control input of the controllable switch, the synchronizing unit being bilaterally connected to the supply unit.

3. A device for magnetic pulse treatment of ferromagnetic materials, as claimed in claim 1, each of said parallel circuits further comprising a third diode connected in parallel with said capacitor, a cathode of said third diode being connected to a cathode of said first diode.

4. A device as claimed in claim 1, said power inductor further comprising said feedback sensor being coupled to said winding.

* * * * *

UNITED STATES PATENT AND TRADEMARK OFFICE
CERTIFICATE OF CORRECTION

PATENT NO. : 4,754,177

DATED : June 28, 1988

INVENTOR(S) : Boris G. Makedonski, Vladimir G. Hristov, Kiril D. Kirilov, Georgi Y. Pundev, Janet I. Mihailova and Nedelcho H. Todorov It is certified that error appears in the above-identified patent and that said Letters Patent is hereby corrected as shown below:

Cover page, column 1, item [75], after "Inventors:," insert:

--Boris G. Makedonski; Vladimir G. Hristov;--.

Signed and Sealed this

Eleventh Day of June, 1991

Attest:

HARRY F. MANBECK, JR.

*Attesting Officer*  *Commissioner of Patents and Trademarks*